United States Patent [19]

Suzuki et al.

[11] Patent Number: 4,688,918
[45] Date of Patent: Aug. 25, 1987

[54] NEGATIVE TYPE PHOTORESIST DEVELOPING APPARATUS

[75] Inventors: Yoshiki Suzuki; Teruhiko Yamazaki, both of Itami, Japan

[73] Assignee: Mitsubishi Denki Kabushiki Kaisha, Tokyo, Japan

[21] Appl. No.: 841,468

[22] Filed: Mar. 20, 1986

[30] Foreign Application Priority Data

Jun. 5, 1985 [JP] Japan ................. 60-121913

[51] Int. Cl.⁴ .............................................. G03D 5/04
[52] U.S. Cl. ................................... 354/325; 134/100; 134/151
[58] Field of Search .............. 354/324, 325, 317; 134/98, 100, 151, 153

[56] References Cited

U.S. PATENT DOCUMENTS

| | | | |
|---|---|---|---|
| 3,604,331 | 9/1971 | Parlin | 354/324 |
| 4,121,236 | 10/1978 | Welp et al. | 354/325 |
| 4,197,000 | 4/1980 | Blackwood | 354/325 |
| 4,564,280 | 1/1986 | Fukuda | 354/317 |

FOREIGN PATENT DOCUMENTS

| | | |
|---|---|---|
| 0005374 | 11/1979 | European Pat. Off. |
| 0095711 | 5/1983 | European Pat. Off. |
| 3225575 | 3/1983 | Fed. Rep. of Germany |
| 3416599 | 11/1985 | Fed. Rep. of Germany |
| 53-64472 | 8/1978 | Japan ................. 354/325 |
| 54-116925 | 11/1979 | Japan ................. 354/324 |
| 52132 | 3/1982 | Japan |
| 56-94290 | 12/1982 | Japan ................. 354/325 |
| 58-23440 | 2/1983 | Japan ................. 354/325 |

Primary Examiner—A. A. Mathews
Attorney, Agent, or Firm—Lowe Price Leblanc Becker & Shur

[57] ABSTRACT

A developer is drawn up from a developer tank (1) by a developer pump (5) and after the flow rate of the developer has been regulated by a developer flow rate control valve (12), the developer passes through a developer flow meter (14) and reaches a pipe (16). A rinse solution is drawn up from a rinse solution tank (2) by a rinse solution pump (6) and after the flow rate of the rinse solution has been regulated by a rinse flow rate control valve (13), the rinse solution attains the pipe (16) through a rinse solution flow meter (15). The developer and the rinse solution are mixed in the pipe (16) so that the mixture is sprayed from a nozzle (17) to a negative type photoresist (11) placed on a specimen table (10). A control unit (18) controls the developer flow rate control valve (12) and the rinse solution flow rate control valve (13) based on the respective flow rate data from the developer flow meter (14) and the rinse solution flow meter (15) so that the flow rate of the developer and that of the rinse solution may be changed continuously from the start of development to the end thereof. As a result, the volume of the exposed portions of the negative type photoresist does not undergo considerable change.

3 Claims, 6 Drawing Figures

NEGATIVE TYPE PHOTORESIST DEVELOPING APPARATUS

BACKGROUND OF THE INVENTION

1. Field of the Invention

The present invention relates to a negative type photoresist developing apparatus and particularly, to a developing apparatus to be used for developing a negative type photoresist in a photolithographic process in manufacturing of a semiconductor device.

2. Description of the Prior Art

Generally, a photoresist is used for selectively etching a semiconductor or an oxide film. In the prior art, developing apparatus for developing an exposed photoresist film is known. For example, Japanese Patent Laid-Open Gazette No. 52132/1982 discloses a semiconductor manufacturing apparatus in which a CPU controls the number of revolutions of a rotating head for placing an exposed semiconductor wafer and the flow rate of a developer to be supplied to the semiconductor wafer so that development can be applied to the semiconductor wafer correctly and in a short period after the exposure of a photoresist film.

FIG. 1 is an illustration showing an example of a conventionaly utilized negative type photoresist developing apparatus using a spray system.

In FIG. 1, a conventional negative type photoresist developing apparatus comprises a developer tank 1, a rinse solution tank 2, a developer feed pipe 3, a rinse solution feed pipe 4, a developer pump 5, a rinse solution pump 6, a developer nozzle 7, a rinse solution nozzle 8, a motor 9 and a specimen table 10. On the specimen table 10, there is placed a specimen 11 having a negative type photoresist film exposed in advance through a specified pattern. A developer is drawn up by the developer pump 5 from the developer tank 1 and sprayed onto the specimen 11 through the developer nozzle 7. The spraying of the developer continues for a fixed period and during the spraying, the motor 9 is generally driven to rotate the specimen 11 so that the developer may be spread evenly. After a lapse of the fixed period, a rinse solution is drawn up by the rinse solution pump 6 from the rinse solution tank 2 and sprayed onto the specimen 11 through the nozzle 8. At this time also, the specimen 11 is rotated.

FIG. 2 is a graph showing changes, according to the passage of time, in the flow rates of the developer and the rinse solution supplied to a photoresist by the conventional negative type photoresist developing apparatus shown in FIG. 1.

In a developing step (a) shown in FIG. 2, the photoresist in the non-exposed regions of the specimen 11, where cross-linking does not proceed dissolves completely in the developer. On the other side, the developer also penetrates into the exposed portions where cross-linking is developed, and dependent on the state of the cross-linking, those exposed photoresist portions also dissolve a little. In addition, the exposed photoresist portions absorb the developer and the volumes thereof are increased considerably. In a developing step (c) shown in FIG. 2, the swelling photoresist portions are contracted by the rinse solution. The change of the volume by this contraction is defined by the energy of the ultraviolet rays, X rays or electron beam applied to the photoresist film.

As described above, in the developing process of a conventional negative type photoresist film, the photoresist film swells considerably by the developer sprayed thereon and then contracts by the rinse solution sprayed thereon subsequently. The photoresist portions where cross-linking is accelerated undergo a stress due to this abrupt contraction. On account of this stress, the pattern obtained after the developing process has an inferior precision and accordingly, it is difficult to form fine patterns using the conventional apparatus.

In addition, for the purpose of mitigating the stress due to the abrupt change from the swelling to the contraction, a step (b) shown in FIG. 2 may be applied so that the developer and the rinse solution can be sprayed simultaneously. However, such step has little effect for mitigating the stress and it is still extremely difficult to form fine patterns.

Furthermore, in order to solve the above described problems, a method for continuously changing the flow rates of the developer and the rinse solution in the developing process may be considered. However, in a conventional negative type photoresist developing apparatus, the flow rates of the developer and the rinse solution are defined by the capacities of the developer pump 5 and the rinse solution pump 6 and the diameters of the nozzles 7 and 8 and as a result, the flow rates cannot be changed.

SUMMARY OF THE INVENTION

Therefore, a principal object of the present invention is to provide a developing apparatus having a function of changing freely and continuously a ratio of mixture of two solutions, that is, a developer and a rinse solution during a period from the beginning to the end of development of a negative type photoresist using a spray system, whereby fine patterns can be formed.

Briefly stated, in the present invention, the respective flow rates of a developer and a rinse solution to be supplied to spray means are set by setting means so as to be changed continuously during a period from the beginning to the end of development. Then, based on the flow rate data of the developer and the rinse solution detected by flow rate detecting means and the flow rate data set in advance by said setting means, flow rate control valves are controlled by control means so that the flow rate of the developer and that of the rinse solution may coincide with the respective set values.

According to the present invention, the flow rate of the developer and the flow rate of the rinse solution are made to coincide with the respective set values so as to be changed continuously, and as a result, the volumes of the exposed portions of a specimen will not be changed considerably.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
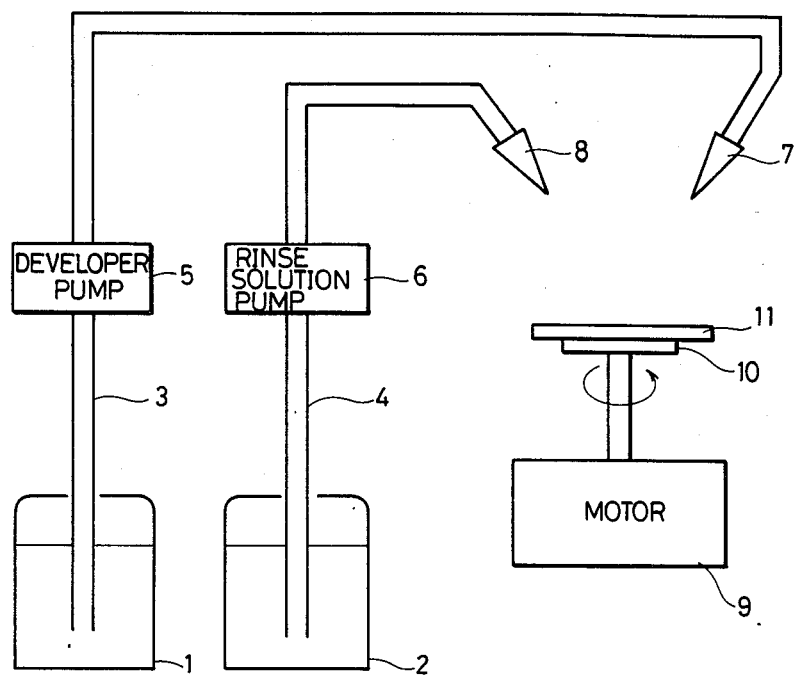
FIG. 1 is an illustration showing a conventional negative type photoresist developing apparatus.
Figure 2:
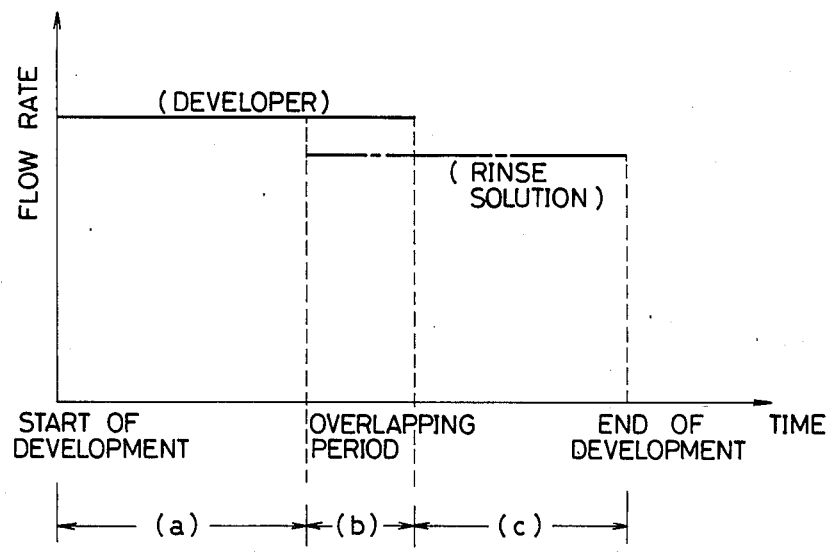
FIG. 2 is a graph showing the flow rate of a developer and that of a rinse solution to be supplied to a photoresist by a conventional negative type photoresist developing apparatus.
Figure 3:
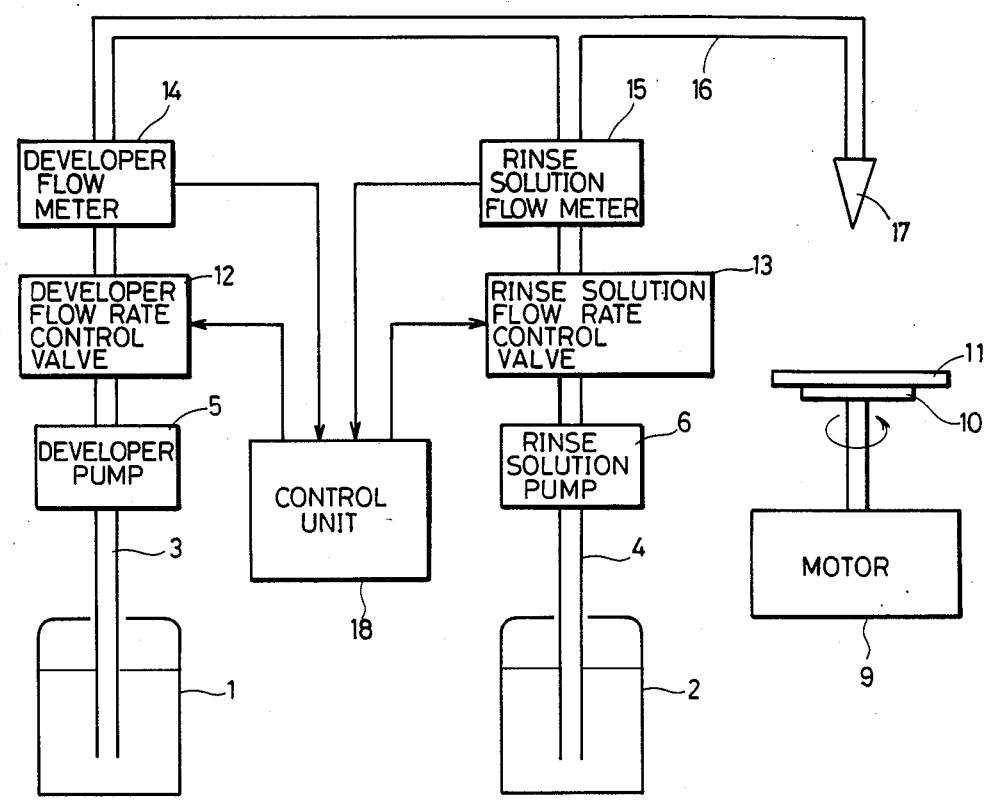
FIG. 3 is an illustration showing a negative type photoresist developing apparatus to which an embodiment of the present invention is applied.

FIG. 3 is an illustration showing a negative type photoresist developing apparatus to which an embodiment of the present invention is applied. Referring to FIG. 3, a negative type photoresist developing apparatus comprises a developer tank 1, a rinse solution tank 2, a developer feed pipe 3, a rinse solution feed pipe 4, a pipe 16, a nozzle 17, a developer pump 5, a rinse solution pump 6, a developer flow rate control valve 12, a rinse solution flow rate control valve 13, a developer flow meter 14, a rinse solution flow meter 15, a control unit 18, a motor 9 and a specimen table 10. On the specimen table 10, a specimen 11 is placed. A developer contained in the developer tank 1 serves to develop the specimen 11. A rinse solution contained in the rinse solution tank 2 serves to wash away the developer and to make the specimen 11 clean. The developer feed pipe 3 feeds the developer to the pipe 16. The rinse solution feed pipe 4 feeds the rinse solution to the pipe 16. The developer and the rinse solution are mixed in the pipe 16. The nozzle 17 sprays the liquid mixed in the pipe 16 onto the specimen 11.

The developer pump 5 sucks up the developer from the developer tank 1 and sends it toward the nozzle 17. The rinse solution pump 6 sucks up the rinse solution from the rinse solution tank 2 and sends it toward the nozzle 17. The developer flow rate control valve 12 controls the flow rate of the developer to be supplied to the nozzle 17. The rinse solution flow rate control valve 13 controls the flow rate of the rinse solution to be supplied to the nozzle 17. The developer flow meter 14 detects the flow rate of the developer. The rinse solution flow meter 15 detects the flow rate of the rinse solution.

The developer flow rate control valve 12, the rinse solution flow rate control valve 13, the developer flow meter 14 and the rinse solution flow meter 15 as described above are electrically connected to the control unit 18. The control unit 18 comprises setting means for setting in advance the flow rates of the developer and the rinse solution and control means for generating a control command signal for controlling the opening or the closing of the developer flow rate control valve 12 and the rinse solution flow rate control valve 13. The motor 9 rotates the specimen table 10.

Figure 4:
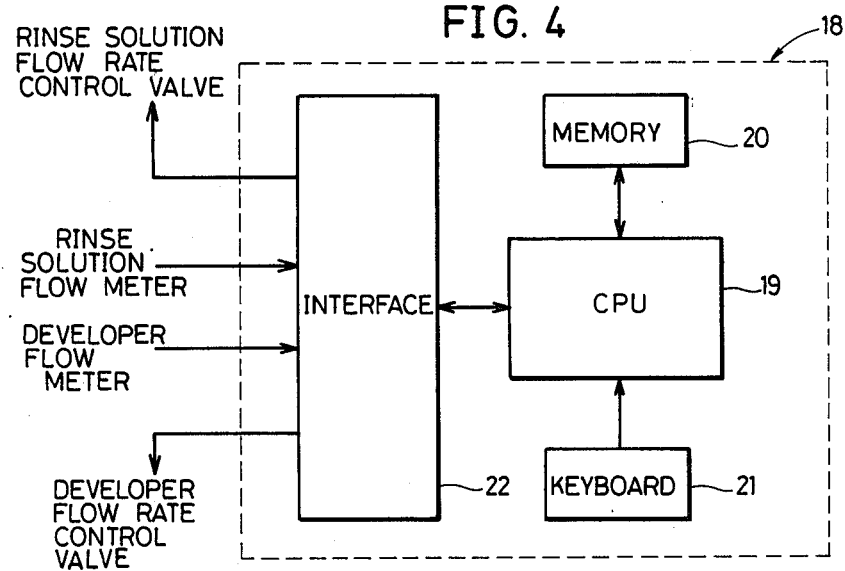
FIG. 4 is a schematic block diagram showing an electrical structure of the control unit shown in FIG. 3.

FIG. 4 is a schematic block diagram showing an electrical structure of the control unit 18 shown in FIG. 3. In FIG. 4, the control unit 18 comprises a CPU19. To the CPU19, a memory 20, a keyboard 21 and an interface 22 are connected.

The CPU19 calculates the respective flow rates of the developer and the rinse solution according to the passage of time based on the data set from the keyboard 21 and generates a control command signal for controlling the opening or the closing of the developer flow rate control valve 12 and the rinse solution flow rate control valve 13 so that the flow rates of the developer and the rinse solution during a period from the beginning to the end of development may coincide with the calculated flow rates.

Figure 5:
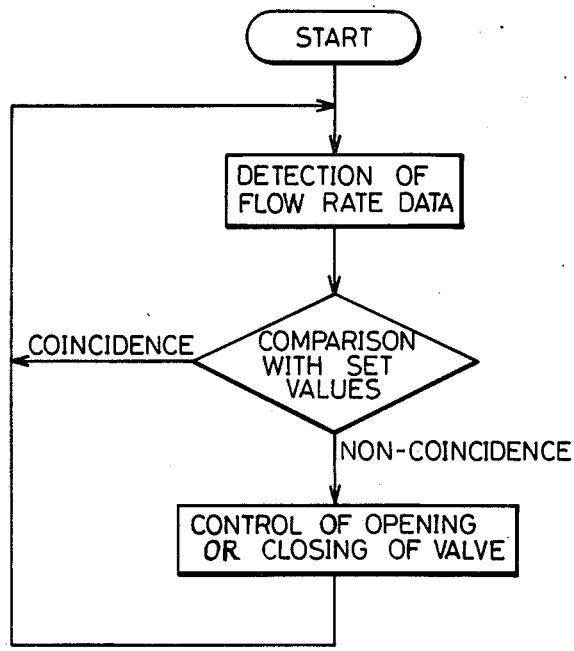
FIG. 5 is a flow chart for explaining the operation of the control unit shown in FIG. 3.

The memory 20 stores not only the set data and the like entered from the keyboard 21 but also an operation program of the CPU19 based on a flow chart as shown in FIG. 5.

The keyboard 21 is used to set in advance the flow rates of the developer and the rinse solution. A set ratio of the developer and the rinse solution is 3:1, for example, at the beginning of development and 1:3, for example, at the end of development.

The interface 22 serves to communicate data between the CPU19 and the above described developer flow rate control valve 12, rinse solution flow rate control valve 13, developer flow meter 14 and rinse solution flow meter 15.

Figure 6:
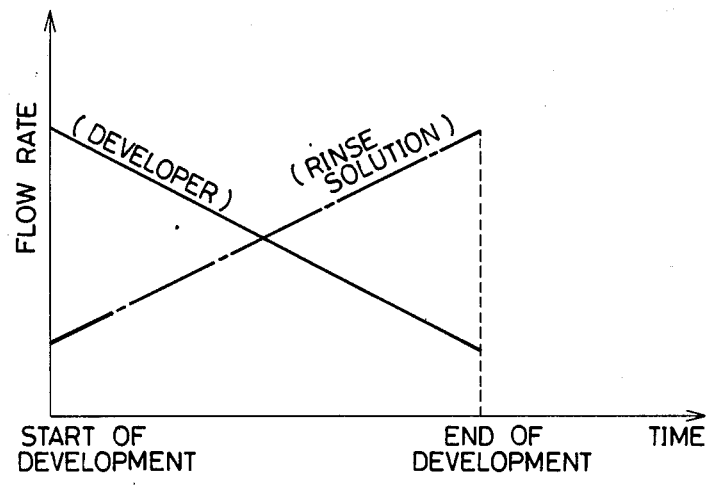
FIG. 6 is a graph showing changes, according to the passage of time, in the flow rates of a developer and a rinse solution to be supplied to a photoresist by the negative type photoresist developing apparatus shown in FIG. 3.

FIG. 5 is a flow chart for explaining the operation of a control unit shown in FIG. 3. FIG. 6 is a graph showing changes in the flow rates of the developer and the rinse solution according to the passage of time in the case of operation based on the flow chart shown in FIG. 5.

Now, referring to FIGS. 3 through 6, the operation of a negative type photoresist developing apparatus in accordance with an embodiment of the present invention will be specifically described.

The operator uses the keyboard 21 prior to the start of development of a negative type photoresist so as to set in advance the ratio of the developer and the rinse solution for the start of developing operation and the ratio for the end thereof. When the operator instructs the start of development, the developer pump 5 sucks up the developer from the developer tank 1 and makes the developer flow through the developer flow rate control valve 12 and the developer flow meter 14 toward the nozzle 17. At this time, the developer flow meter 14 detects the flow rate and supplies the flow rate data to the control unit 18. Similarly, the rinse solution pump 6 sucks up the rinse solution from the rinse solution tank 2 and makes the rinse solution flow toward the nozzle 17 through the rinse solution flow rate control valve 13 and the rinse solution flow meter 15. The rinse solution flow meter 15 detects the flow rate of the rinse solution and supplies the flow rate data to the control unit 18. The developer flow rate data and the rinse solution flow rate data are supplied to the CPU19 through the interface 22.

The CPU19 calculates the respective flow rates needed at the time when the flow rates are detected by the developer flow meter 14 and the rinse solution flow meter 15, respectively, based on the preset ratio data indicating the ratio of the developer and the rinse solution at the beginning of development and the ratio at the end thereof. Then, the CPU19 determines whether the flow rates detected by the respective flow meters coincide with the respective flow rates thus calculated.

If those data are coincident, the CPU19 waits till new flow data are supplied. If the data are not coincident, the CPU19 provides to the interface 22, a control command signal for controlling the opening or the closing of the respective flow rate control valves 12 and 13 according to the difference of the flow rate data. The control command signal is applied through the interface 22 to the flow rate control valve or valves by which the flow rate should be changed and thus, the flow rate control valve opens or closes based on the command signal.

The CPU19 repeats the above described operation each time flow rate data are applied thereto from the developer flow meter 14 and the rinse solution flow meter 15.

Meanwhile, the developer flow meter 14 and the rinse solution flow meter 15 may be adapted to detect the flow rates continuously to supply the detected flow rate data to the control unit 18 or otherwise, they may be adapted to detect the flow rates at fixed time intervals to supply the detected flow rate data to the control unit 18 each time the data are detected.

The developer and the rinse solution are mixed in the pipe 16 and the mixed solution is sprayed from the nozzle 17 to the specimen 11. At this time, the specimen 11 is being rotated by the motor 9. The ratio of the developer and the rinse solution is changed as the time proceeds so as to attain the preset ratio at the end of development. More specifically, as shown in FIG. 6, the ratio of the developer flow rate and the rinse solution flow rate is changed continuously as the developing process proceeds, for example, from 3:1 at the beginning of development to 1:3 at the end thereof.

Thus, the present invention makes it possible to apply such developing process and as a result, a stress caused by an abrupt change from swelling to contraction of the photoresist can be mitigated and it becomes possible to form fine patterns.

For example, in a conventional developing apparatus, the minimum pattern width formed in the case of a remaining film after development having a thickness of 1 $\mu$m was 1.5 $\mu$m. By contrast, in a negative type photoresist developing apparatus in accordance with the present invention, it becomes possible to form a pattern width of 0.6 $\mu$m by changing continuously the ratio of mixture of the developer and the rinse solution.

As the specimen used in the above described embodiment, MES-X (produced by Japan Synthetic Rubber Co.) is coated to a thickness of 1.2 $\mu$m on a silicon wafer and the coating is exposed selectively by soft X rays. As the developer, methyl ethyl ketone is used and as the rinse solution, isopropyl alcohol is used.

Although in the above described embodiment, the developer and the rinse solution are sprayed from the same nozzle 17, the developer and the rinse solution may be sprayed from different nozzles.

In addition, although in the above described embodiment, a developing apparatus using two solutions, that is, the developer and the rinse solution, was described, three or more kinds of solutions may be used. In such a case, it is only necessary to increase the number of the flow rate control mechanisms such as the flow rate control valves and the flow meters shown in the embodiment according to the number of kinds of solutions. Thus, if three or more kinds of solutions are used, the same effects as described above can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A negative type photoresist developing apparatus for developing a negative type photoresist (11) by spraying at least a developer and a rinse solution through spray means (17), comprising:

setting means (18) for setting in advance the respective flow rates of said developer and said rinse solution to be supplied to said spray means (17) for at least the beginning and the end of development, flow rate detecting means (14 and 15) for detecting the respective flow rates of said developer and said rinse solution supplied to said spray means (17), flow rate control valves (12 and 13) for increasing or decreasing the respective flow rates of said developer and said rinse solution supplied to said spray means (17), and control means (18) for controlling said flow rate control valves (12 and 13) based on the respective flow rate data detected by said flow rate detecting means (14 and 15) and the respective flow rate data set by said setting means (18) so that the respective flow rates of said developer and set rinse solution may coincide with the respective set flow rates.

2. A negative type photoresist developing apparatus in accordance with claim 1, wherein said setting means (18) sets the respective flow rates of said developer and said rinse solution for the beginning and for the end of development so that the flow rate of said developer may be decreased continuously and the flow rate of said rinse solution may be increased continuously during the development.

3. A negative type photoresist developing apparatus in accordance with claim 1, wherein said setting means (18) comprises calculating means (19) for calculating the flow rates of said developer and said rinse solution at predetermined moments during the period from the beginning to the end of development, based on the flow rate data of said developer and said rinse solution set by said setting means (18) for the beginning and the end of development, and said control means (18) controls said respective flow rate control valves (12 and 13) based on the flow rate data detected by said flow rate detecting means (14 and 15) and the respective flow rate data calculated by said calculating means (19) so that the respective flow rates of said developer and said rinse solution may coincide with the respective calculated flow rates.

\* \* \* \* \*